(12) United States Patent
McPherson et al.

(10) Patent No.: US 11,984,433 B2
(45) Date of Patent: May 14, 2024

(54) ARRANGEMENTS OF POWER SEMICONDUCTOR DEVICES FOR IMPROVED THERMAL PERFORMANCE

(71) Applicant: Wolfspeed, Inc., Durham, NC (US)

(72) Inventors: Brice McPherson, Fayetteville, AR (US); Benjamin A. Samples, Fayetteville, AR (US); Brandon Passmore, Fayetteville, AR (US)

(73) Assignee: Wolfspeed, Inc., Durham, NC (US)

( * ) Notice: Subject to any disclaimer, the term of this patent is extended or adjusted under 35 U.S.C. 154(b) by 123 days.

(21) Appl. No.: 17/459,497

(22) Filed: Aug. 27, 2021

(65) Prior Publication Data
US 2023/0060641 A1    Mar. 2, 2023

(51) Int. Cl.
*H01L 25/07*     (2006.01)
*H01L 25/00*     (2006.01)
*H01L 25/18*     (2023.01)

(52) U.S. Cl.
CPC ............ *H01L 25/072* (2013.01); *H01L 25/18* (2013.01); *H01L 25/50* (2013.01)

(58) Field of Classification Search
None
See application file for complete search history.

(56) References Cited

U.S. PATENT DOCUMENTS

| 5,243,201 A * | 9/1993 | Bauer ................ H01L 29/0839 257/341 |
| 7,795,045 B2 * | 9/2010 | Griffin ................ B81C 1/00619 257/E21.546 |
| 2013/0299977 A1 * | 11/2013 | Dayringer ........... H01L 25/0657 257/738 |
| 2018/0025963 A1 * | 1/2018 | Miller .................. H01L 23/467 257/721 |

(Continued)

FOREIGN PATENT DOCUMENTS

JP    2002368192 A  * 12/2002

OTHER PUBLICATIONS

Author Unkown, "FF6MR12W2M1_B11," Datasheet, EasyDUAL Module with CoolSiC Trench MOSFET and PressFIT/NTC, Version 2.1, May 31, 2019, Infineon, 7 pages.

*Primary Examiner* — Michael Lebentritt
(74) *Attorney, Agent, or Firm* — BakerHostetler

(57) ABSTRACT

Power semiconductor devices, and more particularly arrangements of power semiconductor devices for improved thermal performance in high power applications are disclosed. Arrangements for multiple power semiconductor devices within a package and/or module are provided that more efficiently utilize the active device area of each power semiconductor device for a given operational specification. Certain arrangements are provided that reduce the effects of thermal crowding in order to provide increased power capability or a similar power capability in a reduced device size. Improved thermal balancing may be provided by (Continued)

variable spacing and/or variable offset distances between next-adjacent power semiconductor devices. In this manner, active areas of power devices and/or modules may include an increased density of power semiconductor devices within a given area while also exhibiting improved thermal profiles during operation, thereby providing improved operating characteristics and/or increased operating lifetimes.

33 Claims, 11 Drawing Sheets

(56) References Cited

U.S. PATENT DOCUMENTS

2021/0143041 A1* 5/2021 Fricker ................. H01L 23/544
2021/0313243 A1 10/2021 McPherson
2021/0313256 A1 10/2021 McPherson et al.

* cited by examiner

ARRANGEMENTS OF POWER SEMICONDUCTOR DEVICES FOR IMPROVED THERMAL PERFORMANCE

FIELD OF THE DISCLOSURE

The present disclosure relates to power semiconductor devices, and particularly to arrangements of power semiconductor devices for improved thermal performance in high power applications.

BACKGROUND

Semiconductor devices such as transistors and diodes are ubiquitous in modern electronic devices. Wide bandgap semiconductor material systems such as gallium nitride (GaN) and silicon carbide (SiC) are being increasingly utilized in semiconductor devices to push the boundaries of device performance in areas such as switching speed, power handling capability, and thermal conductivity. Examples include individual devices such as metal-oxide-semiconductor field-effect transistors (MOSFETs), metal-insulator-semiconductor field-effect transistors (MISFETs), insulated gate bipolar transistors (IGBTs), Schottky barrier diodes, PiN diodes, high electron mobility transistors (HEMTs), and integrated circuits such as monolithic microwave integrated circuits (MMICs) that include one or more individual devices.

In high power applications, multiple semiconductor devices for all or a portion of a circuit are often packaged in electronic modules. These modules are generally referred to as power modules that are housed in a thermoplastic, epoxy, or like molded housing that encapsulates the components and the circuit board or substrate on which the components are mounted. The input/output connections for the power module are provided by terminal assemblies that extend out of the housing to facilitate incorporation in and connection to other systems. Such systems may include electric vehicles, power conversion and control, and the like.

Semiconductor devices and power modules are continuously being developed with improved operating characteristics in order to meet and enable the evolving demands of modern electronics. The art continues to seek improved semiconductor devices and power modules that are capable of overcoming challenges associated with conventional devices.

SUMMARY

The present disclosure relates to power semiconductor devices, and more particularly to arrangements of power semiconductor devices for improved thermal performance in high power applications. Arrangements for multiple power semiconductor devices within a package and/or module are provided that more efficiently utilize the active device area of each power semiconductor device for a given operational specification. Certain arrangements are provided that reduce the effects of thermal crowding in order to provide increased power capability or a similar power capability in a reduced device size. Improved thermal balancing may be provided by variable spacing and/or variable offset distances between next-adjacent power semiconductor devices. In this manner, active areas of power devices and/or modules may include an increased density of power semiconductor devices within a given area while also exhibiting improved thermal profiles during operation, thereby providing improved operating characteristics and/or increased operating lifetimes.

In one aspect, a power module comprises: a substrate; and a plurality of power semiconductor devices on the substrate, wherein the plurality of power semiconductor devices is electrically coupled to form at least a portion of a power circuit, wherein: the plurality of power semiconductor devices is arranged in at least one row; and a spacing between next-adjacent power semiconductor devices of the plurality of power semiconductor devices along the at least one row is variable. In certain embodiments, the spacing between the next-adjacent power semiconductor devices is larger along central portions of the at least one row. In certain embodiments, the spacing between the next-adjacent power semiconductor devices is smaller along peripheral portions of the at least one row.

In certain embodiments, the at least one row extends in a first direction on the substrate and the spacing between the next-adjacent power semiconductor devices is less than a width of each power semiconductor device of the plurality of power semiconductor devices, wherein the width is measured in the first direction. In certain embodiments, each power semiconductor device of the plurality of power semiconductor devices in the at least one row is electrically coupled in parallel. In certain embodiments, the at least one row extends in a first direction on the substrate; and the spacing between the next-adjacent power semiconductor devices along the at least one row decreases from a central portion of the at least one row toward a peripheral portion of the at least one row. The plurality of power semiconductor devices in the at least one row may comprise an even number of power semiconductor devices or an odd number of power semiconductor devices. In certain embodiments, positions of the next-adjacent power semiconductor devices are provided in a linear arrangement along the first direction of the at least one row. In certain embodiments, positions of the next-adjacent power semiconductor devices are provided in a nonlinear arrangement along the first direction of the at least one row. In certain embodiments, positions of the next-adjacent power semiconductor devices of the plurality of power semiconductor devices are offset with one another by an offset distance as measured in a second direction that is different than the first. In certain embodiments, the offset distance is uniform across the at least one row. In other embodiments, the offset distance is smaller at peripheral portions of the at least one row than at central portions of the at least one row. The nonlinear arrangement may form a zig-zag arrangement along the at least one row or a curved arrangement along the at least one row.

In certain embodiments, the power module further comprises: a baseplate, wherein the substrate is arranged on the baseplate; a housing on the baseplate; and a cover over the housing, wherein the baseplate, the housing, and the cover are arranged to enclose the plurality of power semiconductor devices. In certain embodiments, the spacing is in a range from greater than 0 millimeters (mm) to 5 mm. In certain embodiments, the substrate comprises at least one of a lead frame structure and a power substrate.

In another aspect, a power module comprises: a substrate; and a plurality of power semiconductor devices on the substrate, wherein the plurality of power semiconductor devices is electrically coupled to form at least a portion of a power circuit, wherein: the plurality of power semiconductor devices is arranged in at least one row that extends in a first direction on the substrate; and positions of next-adjacent power semiconductor devices of the plurality of power semiconductor devices are offset with one another by an offset distance as measured in a second direction that is different than the first direction. In certain embodiments, a spacing between the next-adjacent power semiconductor devices along the first direction is uniform. In certain embodiments, a spacing between the next-adjacent power semiconductor devices along the first direction is variable. In certain embodiments, the offset distance is uniform across the at least one row. In certain embodiments, the offset distance is smaller at peripheral portions of the at least one row than at central portions of the at least one row. In certain embodiments, the offset distance is less than a length of each of the next-adjacent power semiconductor devices, wherein the length is measured in the second direction. The positions of the next-adjacent power semiconductor devices may form a zig-zag arrangement along the at least one row. In certain embodiments, a spacing between the next-adjacent power semiconductor devices along the first direction is less than a width of each power semiconductor device of the plurality of power semiconductor devices in the at least one row. In certain embodiments, each power semiconductor device of the plurality of power semiconductor devices in the at least one row is electrically coupled in parallel. In certain embodiments, the substrate comprises at least one of a lead frame structure and a power substrate.

In another aspect, a method comprises: providing a power module; providing a plurality of power semiconductor devices in at least one row within the power module; and determining an arrangement of the at least one row based on a predetermined thermal profile of the plurality of power semiconductor devices, wherein the at least one row comprises at least one of a variable spacing between next-adjacent power semiconductor devices of the plurality of power semiconductor devices and a variable offset distance between next-adjacent power semiconductor devices of the plurality of power semiconductor devices. In certain embodiments, the predetermined thermal profile is based on a uniform spacing between the next-adjacent power semiconductor devices that is less than a width of each power semiconductor device. In certain embodiments, the variable spacing between the next-adjacent power semiconductor devices is less than the width of each power semiconductor device. In certain embodiments, the at least one row extends in a first direction; and the offset distance is less than a length of each of the next-adjacent power semiconductor devices, wherein the length is measured in a second direction that is different than the first direction. In certain embodiments, the offset distance is smaller at peripheral portions of the at least one row than at central portions of the at least one row.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
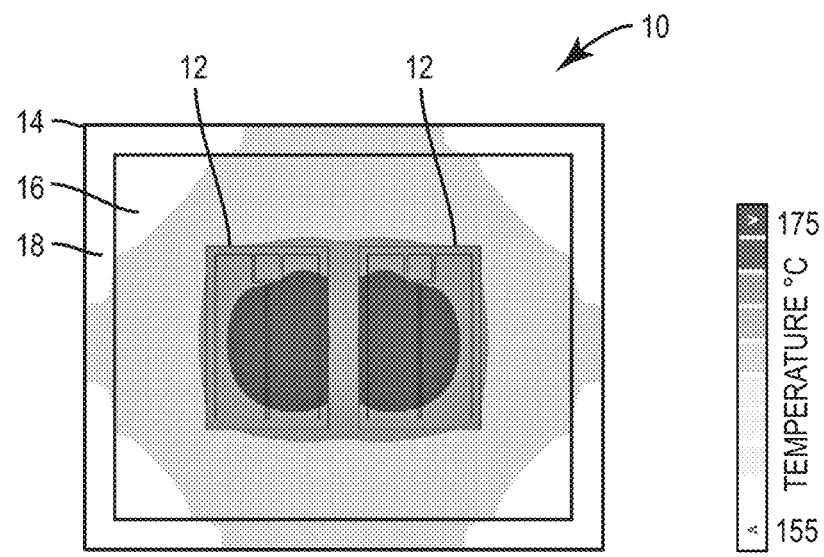
FIG. 1A illustrates a thermal simulation from a top view of a portion of a power module where two power semiconductor devices are provided in an arrangement that exhibits thermal crowding.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to power semiconductor devices, and more particularly to arrangements of power semiconductor devices for improved thermal performance in high power applications. Arrangements for multiple power semiconductor devices within a package or module are provided that more efficiently utilize the active device area of each power semiconductor device for a given operational specification. Certain arrangements are provided that reduce the effects of thermal crowding in order to provide increased power capability or a similar power capability in a reduced device size. Improved thermal balancing may be provided by variable spacing and/or variable offset distances between next-adjacent power semiconductor devices. In this manner, active areas of power devices and/or modules may include an increased density of power semiconductor devices within a given area while also exhibiting improved thermal profiles during operation, thereby providing improved operating characteristics and/or increased operating lifetimes.

In certain aspects, the present disclosure relates to power modules that are used in high power applications. Power modules may contain one or more power semiconductor devices, such as metal-oxide-semiconductor field-effect transistors (MOSFETs), insulated gate bipolar transistors (IGBTs), diodes, and the like, arranged into a variety of circuit topologies. Typical circuit topologies include, but are not limited to, a single switch, a half H-bridge circuit, a full H-bridge circuit, and three-phase topologies, which may often be referred to as a six-pack.

Wide bandgap semiconductor material systems such as gallium nitride (GaN) and silicon carbide (SiC) are increasingly being utilized in power semiconductor devices and power modules due to their improved performance characteristics, including high voltage blocking, low on-resistance, high current, fast switching, low switching losses, high junction temperature operation, and high thermal conductivity. Ultimately, these characteristics result in a notable increase in potential power density, which is power processed per area or volume. Achieving this potential, however, requires addressing significant challenges at the package and system level. The internal layout, or physical arrangement of semiconductor devices within a power module or other device, has a prominent influence on each of these factors. It becomes increasingly more difficult to realize such potential as the number and/or density of semiconductor devices within a package or module increases.

In various applications, multiple power semiconductor devices in power modules may be coupled in parallel with one another to increase power handling. Paralleling is a common technique for power semiconductor devices, including wide bandgap devices, to increase the current of a package or module. Devices are paralleled to increase active device area within a package or module, thereby allowing for higher currents and power levels. With more devices in parallel, tradeoffs between heat spreading, power loop inductance, signal loop inductance, and package size become progressively more difficult to balance. Localized thermal crowding, especially in devices and modules with increased operational currents, has a negative influence on efficient use of active device areas of semiconductor devices. When a notable temperature delta is present across paralleled semiconductor devices within a switch position, some amount of potential current in certain ones of the semiconductor devices is not being utilized as overall device operation may be limited by the hottest active device areas in other semiconductor devices. Since the power semiconductor devices are generally the most expensive part in a power module in most applications, inefficient use of all paralleled semiconductor devices serves to increase costs further. According to aspects of the present disclosure, layouts for multiple power semiconductor devices within a package or module are provided that utilize the active device area of each power semiconductor device as efficiently as possible for a given operational specification.

FIG. 1A illustrates a thermal simulation from a top view of a portion of a power module 10 where two power semiconductor devices 12 are provided in an arrangement that exhibits thermal crowding. The power semiconductor devices 12 may embody one or more of MOSFETs, IGBTs, diodes, and the like. In certain embodiments, the power semiconductor devices 12 may embody wide bandgap semiconductor devices, including SiC-based devices. In FIG. 1A, the power semiconductor devices 12 are illustrated on a substrate 14 that includes a metal trace 16 that is thermally coupled with the power semiconductor devices 12. In further embodiments, the metal trace 16 is thermally and electrically coupled with the power semiconductor devices 12, thereby providing at least one common electrical connection for paralleling the power semiconductor devices 12. The metal trace 16, which may comprise copper or alloys thereof, may be provided on a dielectric layer 18 of the substrate 14. In embodiments where the metal trace 16 and the dielectric layer are present, the substrate 14 may be referred to as a power substrate. In other embodiments, the dielectric layer 18 may be omitted and the metal trace 16 may embody a lead frame structure. In this regard, the term "substrate" as used herein may refer to at least one of a power substrate and a lead frame structure, depending on the embodiment.

In FIG. 1A, the power semiconductor devices 12 are arranged with a close spacing relative to one another at a central portion of the substrate 14. During operation, the power semiconductor devices 12 generate heat and the substrate 14 and metal trace 16 may serve as a heat sink that beneficially spreads heat in a lateral and vertical manner away from the power semiconductor devices 12. By effectively spreading heat away, the power semiconductor devices 12 may be operated with improved performance characteristics while maintaining the power semiconductor devices 12 below maximum operating temperatures. However, thermal linking formed by overlapping heat spreading paths may occur when the power semiconductor devices 12 are positioned close to one another. In FIG. 1A, this is represented as a hot spot that encompasses both power semiconductor devices 12, particularly portions of the power semiconductor devices 12 that are closest to one another. This thermal linking creates a thermal gradient within each individual power semiconductor device 12 and a collective thermal gradient across the combined area of the power semiconductor devices 12. In this regard, the hot spots serve to limit operation below maximum operating temperatures for the entire active areas of each of the power semiconductor devices 12, thereby limiting achievable device power.

Figure 1B:
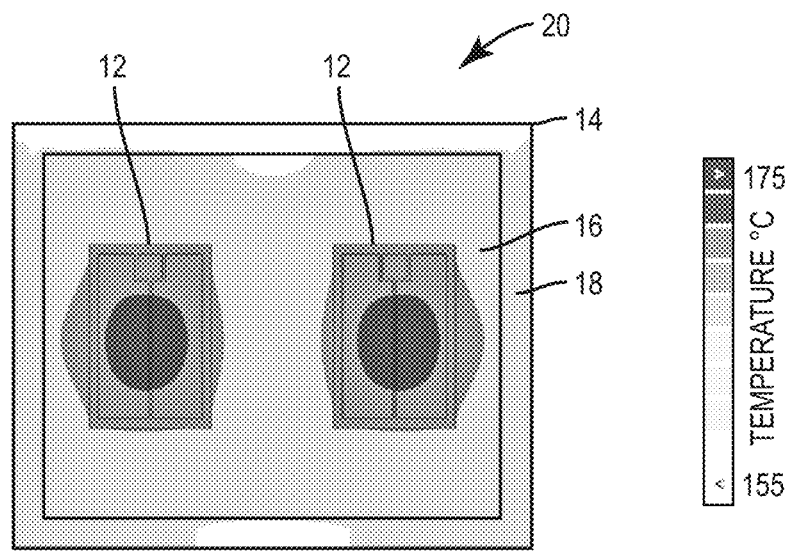
FIG. 1B illustrates a thermal simulation from a top view of a portion of a power module that is similar to the power module of FIG. 1A, but where the power semiconductor devices are provided farther apart to one another to reduce thermal overlap and corresponding thermal gradients.

For comparison, FIG. 1B illustrates a thermal simulation from a top view of a portion of a power module 20 that is similar to the power module 10 of FIG. 1A, but where the power semiconductor devices 12 are provided farther apart to one another. For comparison purposes, all simulation parameters, including thermal loading and heat sinking capabilities, for FIG. 1B are the same as for FIG. 1A, except for the spacing of the power semiconductor devices 12. In FIG. 1B, thermal linking is reduced by the increased spacing. In this regard, the power semiconductor devices 12 in FIG. 1B exhibit cooler operating temperatures as much as about 5° C. lower and with reduced thermal gradients.

As previously described, paralleling of multiple power semiconductor devices within a power module may be employed to provide increased power handling. When a power module is populated with more power semiconductor devices, the spacing between individual power semiconductor devices may be limited by overall device size and/or an overall package footprint of the power module. With minimal spacing, the resulting thermal overlaps may create higher temperature gradients across the switch position of the power module. In particular, the power semiconductor devices in central portions can be significantly hotter than power semiconductor devices at edges of a power substrate and/or lead frame structure. Hence, paralleling increased numbers of power semiconductor devices can create thermal disparities in which some power semiconductor devices are not being utilized effectively. Other factors in the power module may also have an influence on these thermal gradients, such as thickness of the metal traces/lead frame structure and/or the power substrate, and other methods of cooling that may be provided.

Figure 2A:
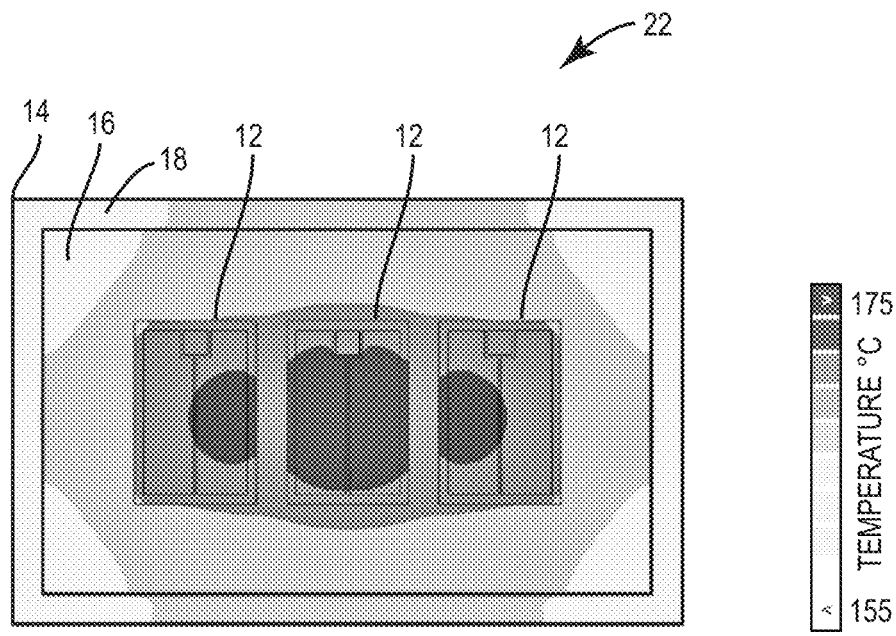
FIG. 2A illustrates a thermal simulation from a top view of a portion of a power module where three power semiconductor device are provided in a row arrangement that exhibits thermal crowding.
Figure 2B:
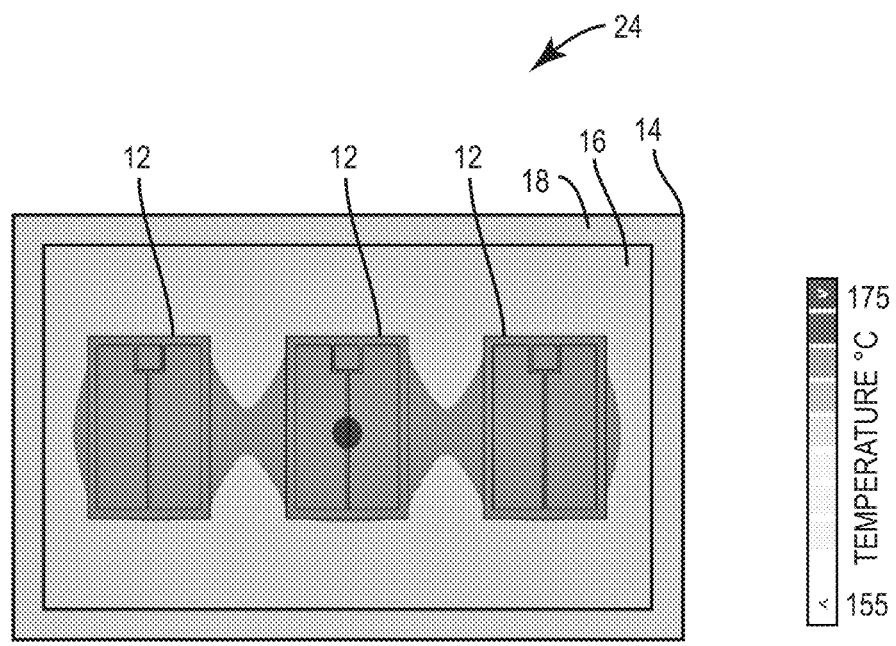
FIG. 2B illustrates a thermal simulation from a top view of a portion of a power module that is similar to the power module of FIG. 2A, but where the power semiconductor devices are provided farther apart from one another in the row to reduce thermal overlap and corresponding thermal gradients.

FIGS. 2A and 2B illustrate thermal simulations that are similar to FIGS. 1A and 1B, but for power modules with increased numbers of the power semiconductor devices 12. FIG. 2A illustrates a thermal simulation from a top view of a portion of a power module 22 where three power semiconductor devices 12 are provided in a row arrangement that exhibits thermal crowding. FIG. 2B illustrates a thermal simulation from a top view of a portion of a power module 24 that is similar to the power module 22 of FIG. 2A, but where the power semiconductor devices 12 are provided farther apart from one another in the row. As with FIGS. 1A and 1B, the arrangements illustrated in FIGS. 2A and 2B represent simulations with identical thermal loading and heat sinking. In FIG. 2A, the centrally located power semiconductor device 12 exhibits notably increased temperature due to thermal overlap from both of the end power semiconductor devices 12 of the row. With such a gradient across device position in the row, a maximum power and associated current is limited by the hottest device, e.g., the middle power semiconductor device 12. Consequently, the colder power semiconductor devices 12 at ends of the row are not able to be utilized to their full potential. As shown in FIG. 2B, the increased spacing provides reduced thermal overlap and the resulting temperature difference between the power semiconductor devices 12 is reduced.

While the idealized spacing of FIGS. 1B and 2B may reduce thermal operating gradients, such arrangements may also serve to limit overall device power by limiting an overall number of the power semiconductor devices that may be arranged in a given area on a power substrate and/or lead frame structure. According to aspects of the present disclosure, arrangements of power semiconductor devices are provided that balance the effects of thermal crowding while also providing increased power capability for a same amount of device area. Aspects of the present disclosure may also provide arrangements of power semiconductor devices that mitigate thermal crowding in order to provide similar power capabilities for reduced device area sizes.

Figure 3A:
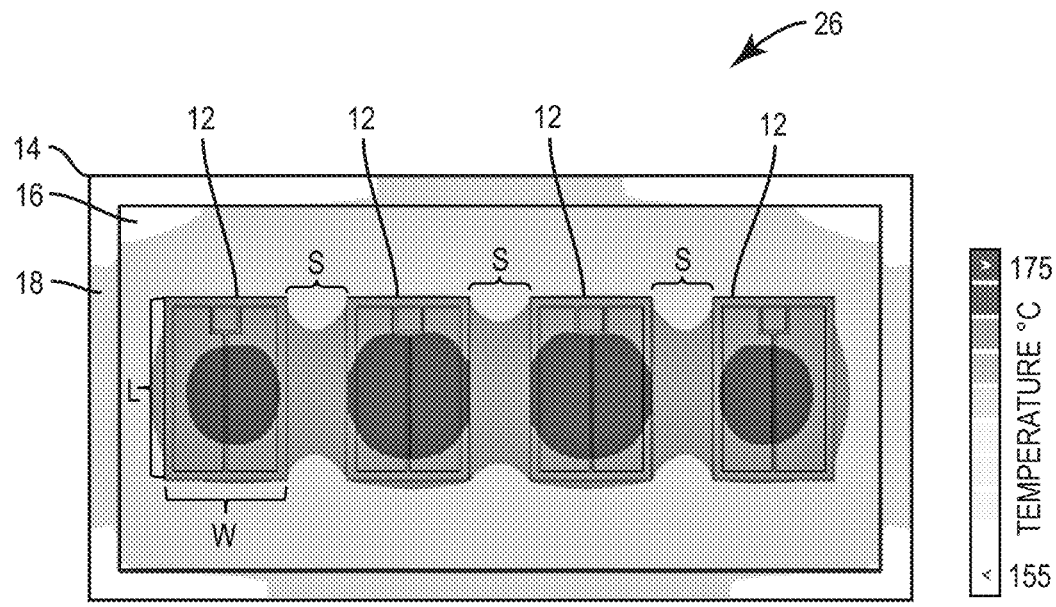
FIG. 3A illustrates a thermal simulation from a top view of a portion of a power module where four power semiconductor devices are provided in an evenly spaced row arrangement that exhibits thermal crowding.
Figure 3B:
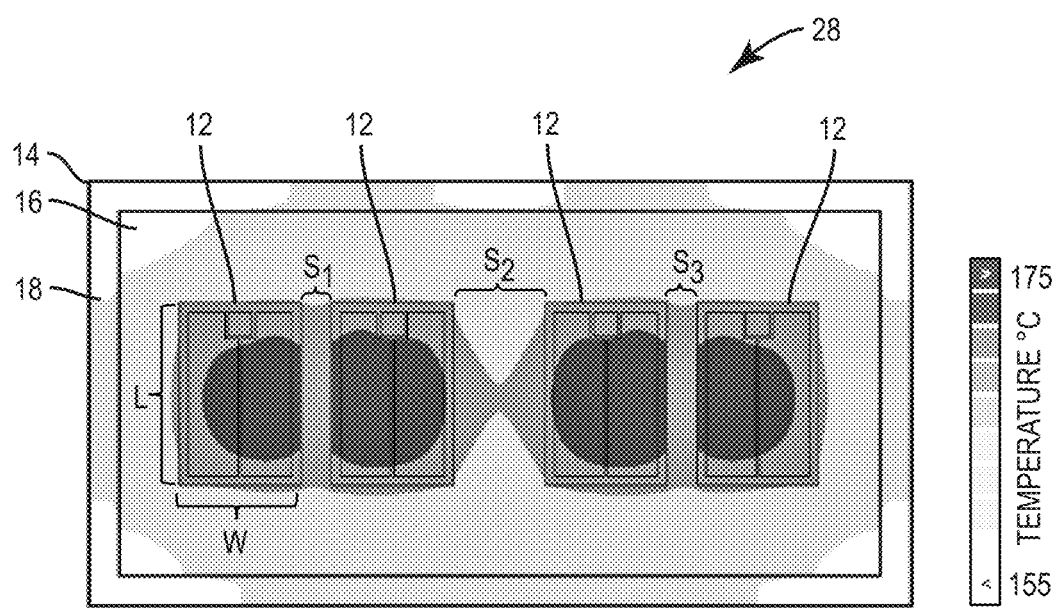
FIG. 3B illustrates a thermal simulation from a top view of a portion of a power module that is similar to the power module of FIG. 3A, but where the power semiconductor devices are provided with variable spacing along the row to reduce thermal overlap and corresponding thermal gradients.

FIGS. 3A and 3B illustrate thermal simulations for power modules with increased numbers of the power semiconductor devices 12 for arrangements that exhibit increased thermal crowding (i.e., FIG. 3A) and other arrangements that exhibit reduced thermal crowding (i.e., FIG. 3B) according to aspects of the present disclosure. In certain aspects, the power semiconductor devices 12 in each of FIGS. 3A and 3B are arranged to form a row of parallel connected devices. The parallel arrangement may include a common electrical contact by way of the metal trace 16. The row of power semiconductor devices 12 in FIGS. 3A and 3B is arranged to extend along a first direction (i.e., a horizontal direction in FIGS. 3A and 3B). Each of the power semiconductor devices 12 comprises a width W and a length L, and the width W is aligned and/or measured in the same direction that the row extends.

FIG. 3A illustrates a thermal simulation from a top view of a portion of a power module 26 where four power semiconductor devices 12 are provided in an evenly spaced row arrangement that exhibits thermal crowding. A spacing S is uniformly defined between next-adjacent power semiconductor devices 12 along the direction of the row, wherein the spacing S is less than the width W of the power semiconductor devices 12. As illustrated, the middle two power semiconductor devices 12 in central portions of the row have larger hotter areas due to increased thermal overlap than the power semiconductor devices 12 at end or peripheral portions of the row.

FIG. 3B illustrates a thermal simulation from a top view of a portion of a power module 28 that is similar to the power module 26 of FIG. 3A, but where the power semiconductor devices 12 are provided with a variable spacing along the row. As illustrated, the row of power semiconductor devices 12 extends in the first direction (i.e., a horizontal direction in FIG. 3B) and spacings $S_1$ to $S_3$ are variably defined between next-adjacent pairs of the power semiconductor devices 12 along the first direction. In particular, the spacing $S_2$ that is provided between next-adjacent power semiconductor devices 12 at the center of the row is greater than the spacings $S_1$, $S_3$ that are closer to end portions of the row. The spacings $S_1$ and $S_3$ may be the same in certain embodiments. In other embodiments, the spacings $S_1$ and $S_3$ may be different to further compensate for any thermal differences that may be present in the power module 28 at different ends of the row. By providing the centrally located spacing $S_2$ that is greater than the peripherally located spacings $S_1$ and $S_3$, thermal overlap for the middle two power semiconductor devices 12 may be reduced, thereby reducing thermal gradients with the end power semiconductor devices 12 of the row. In certain embodiments, this reduced thermal gradient may be provided while maintaining each of the spacings $S_1$ to $S_3$ that define the row with values that are less than the width W of the power semiconductor devices 12 in the first direction. For example, the spacings $S_1$ to $S_3$ may be provided with values that are from less than or equal to 5 millimeters (mm), or less than or equal to 2.5 mm, or less than or equal to 1 mm, or in any range from above 0 mm to any of the aforementioned upper boundaries, for example in a range from greater than 0 mm to 5 mm, or in a range from greater than 0 mm to 2.5 mm, or in a range from greater than 0 mm to 1 mm, or in a range from 0.5 mm to 5 mm, or in a range from 0.5 mm to 2.5 mm, or in a range from 0.5 mm to 1 mm, depending on the relative size of the power semiconductor devices 12.

Figure 4A:
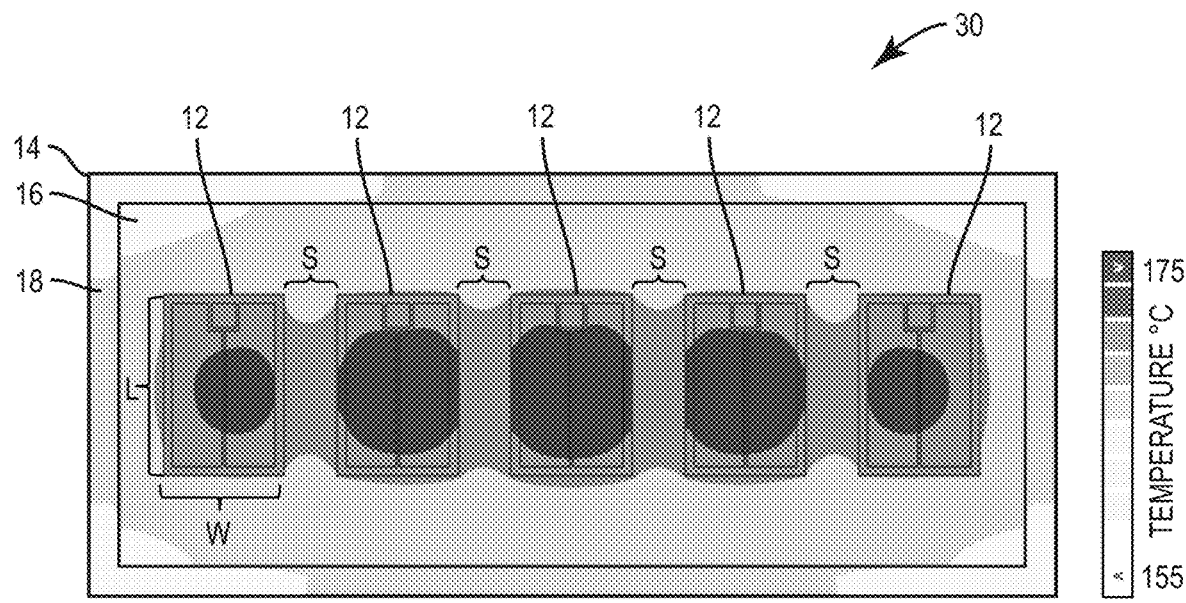
FIG. 4A illustrates a thermal simulation from a top view of a portion of a power module where five power semiconductor devices are provided in an evenly spaced row arrangement that exhibits thermal crowding.
Figure 4B:
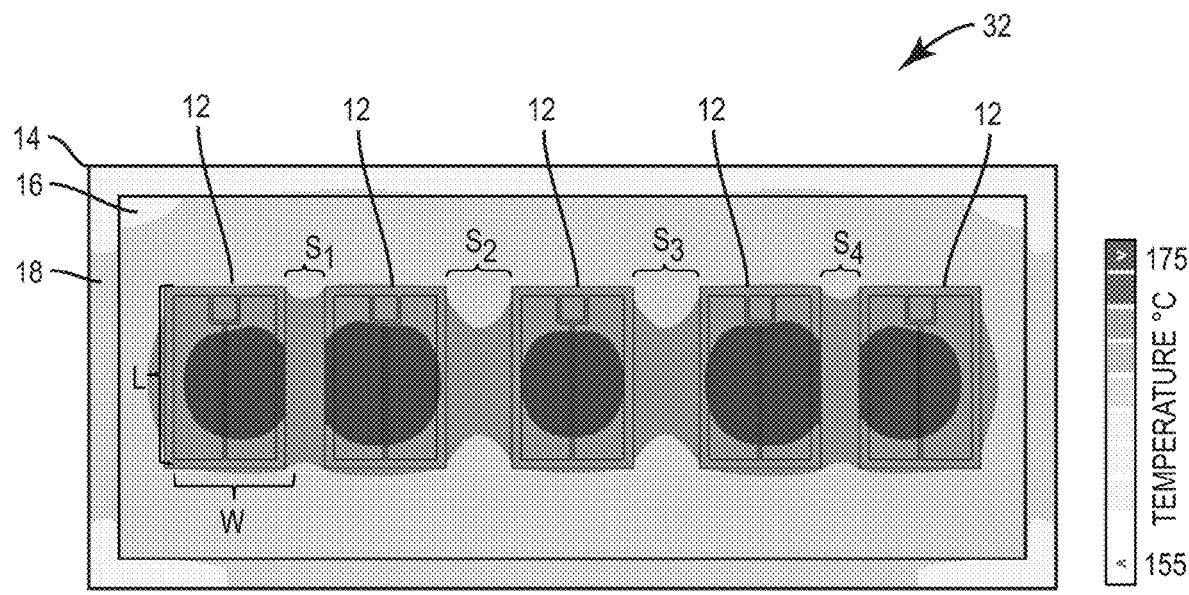
FIG. 4B illustrates a thermal simulation from a top view of a portion of a power module that is similar to the power module of FIG. 4A, but where the power semiconductor devices are provided with variable spacing along the row according to certain aspects of the present disclosure in order to reduce thermal overlap and corresponding thermal gradients.

FIGS. 4A and 4B illustrate thermal simulations for power modules with increased numbers of the power semiconductor devices 12 for arrangements that exhibit increased thermal crowding (i.e., FIG. 4A) and other arrangements that exhibit reduced thermal crowding (i.e., FIG. 4B) according to aspects of the present disclosure. In certain aspects, the power semiconductor devices 12 in each of FIGS. 4A and 4B are arranged to form a row of parallel connected devices, and the row is arranged to extend along a first direction (i.e., a horizontal direction in FIGS. 4A and 4B). Each of the power semiconductor devices 12 comprises a width W and a length L, and the width W is aligned and/or measured in same direction that the row extends. As with previous embodiments, the parallel arrangement may include a common electrical contact by way of the metal trace 16.

FIG. 4A illustrates a thermal simulation from a top view of a portion of a power module 30 where five power semiconductor devices 12 are provided in an evenly spaced row arrangement that exhibits thermal crowding. The spacing S is uniformly defined between next-adjacent power semiconductor devices 12 along the direction of the row, wherein the spacing S is less than the width W of the power semiconductor devices 12. As illustrated, the middle three power semiconductor devices 12 in central portions of the row have larger hotter areas due to increased thermal overlap than the power semiconductor devices 12 at end or peripheral portions of the row.

FIG. 4B illustrates a thermal simulation from a top view of a portion of a power module 32 that is similar to the power module 30 of FIG. 4A, but where the power semiconductor devices 12 are provided with variable spacing along the row. As illustrated, the row of power semiconductor devices 12 extends in the first direction (i.e., a horizontal direction in FIG. 4B) and spacings $S_1$ to $S_4$ are variably defined between next-adjacent pairs of the power semiconductor devices 12 along the first direction. In particular, the spacings $S_2$, $S_3$ that are provided between next-adjacent power semiconductor devices 12 at or near the center of the row are greater than the spacings $S_1$, $S_4$ that are closer to end portions of the row.

As with previous embodiments, the spacings $S_1$ and $S_4$ may be the same in certain embodiments. In other embodiments, the spacings $S_1$ and $S_4$ may be different to further compensate for any thermal differences that may be present in the power module 32 at different ends of the row. In a similar manner, the centrally located spacings $S_2$, $S_3$ may be the same or different for similar reasons. By providing the centrally located spacings $S_2$, $S_3$ that are greater than the peripherally located spacings $S_1$, $S_4$, thermal overlap for the middle three power semiconductor devices 12 may be reduced, thereby reducing thermal gradients with the end power semiconductor devices 12 of the row. In certain embodiments, this reduced thermal gradient may be provided while maintaining each of the spacings $S_1$ to $S_4$ that define the row with values that are less than the width W of each of the power semiconductor devices 12 in the first direction. In particular, the spacings $S_1$ to $S_4$ may comprise any of the ranges described above for FIG. 3B, depending on a size of the power semiconductor devices 12.

FIGS. 4A and 4B may further represent a method for determining the arrangement for the power semiconductor devices 12 based on characterizing them in a first row as illustrated in FIG. 4A and then determining the arrangement for a second row as illustrated in FIG. 4B. In a first step, a thermal profile of the module 30 of FIG. 4A may be determined for a uniform spacing S between the power semiconductor devices 12. In a particular example, the spacing S within the row may be less than the width W of individual ones of the power semiconductor devices 12. In this manner, the predetermined thermal profile includes a die-to-die temperature relationship for the power semiconductor devices 12. Once the predetermined thermal profile, including any undesirable thermal overlap, is provided for the module 30 of FIG. 4A, the precise arrangement of the row for the module 32 of FIG. 4B may then be determined based on the predetermined thermal profile of the module 30 of FIG. 4A. In this regard, the module 32 of FIG. 4B may exhibit reduced thermal gradients due to thermal overlap, thereby providing an improved density of power semiconductor devices in an active area and with reduced thermal limitations. This may advantageously provide a more uniform operating temperature across the power module 32 of FIG. 4B so that no single power semiconductor device 12 disproportionately limits operating conditions for other power semiconductor devices 12. Such a method may be applicable to any of the previously described arrangements and to any of the following embodiments described below.

Figure 5:
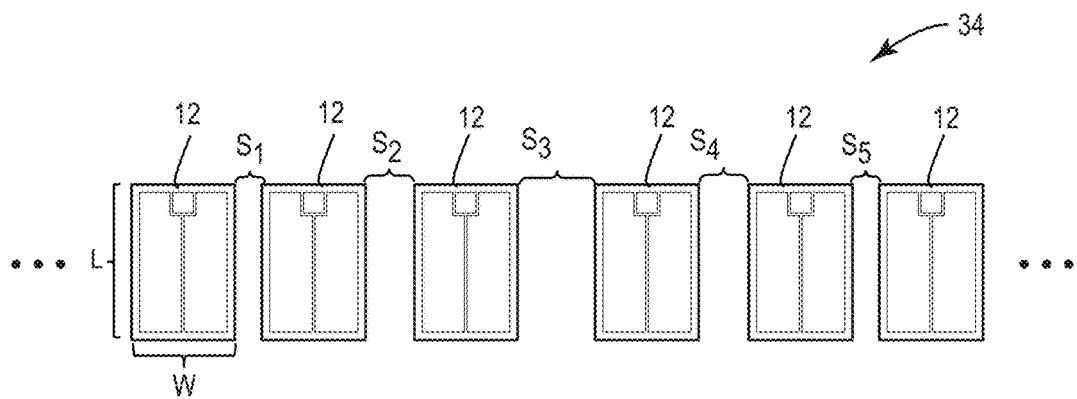
FIG. 5 illustrates a top view of an even-numbered row of power semiconductor devices that may be arranged in any of the power modules described herein.
Figure 6:
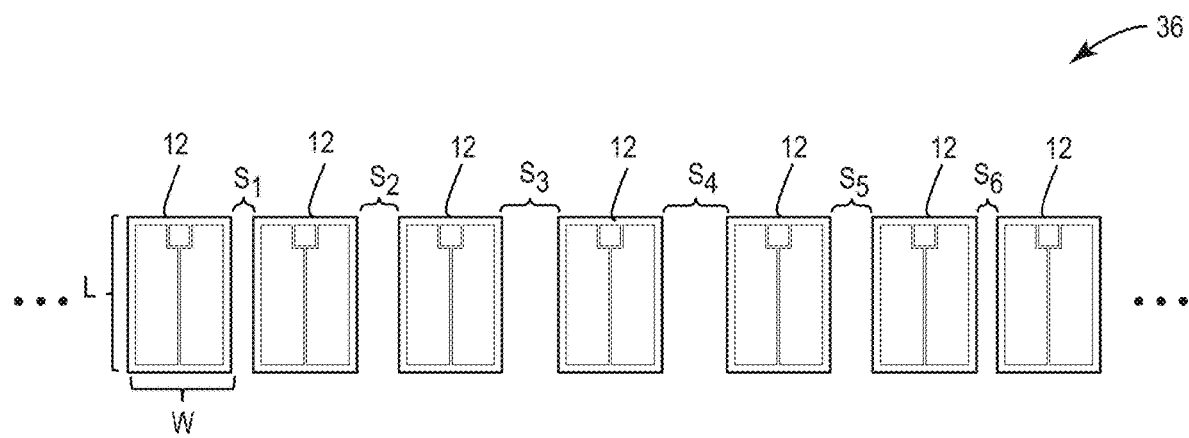
FIG. 6 illustrates a top view of an odd-numbered row of power semiconductor devices that may be arranged in any of the power modules described herein.

Aspects of the present disclosure may be applicable to rows of any number of power semiconductor devices, including even-numbered rows and odd-numbered rows. FIG. 5 illustrates a top view of an even-numbered row 34 of power semiconductor devices 12 that may be provided in any of the power modules described herein. As illustrated, when the row 34 is provided with an even number of the power semiconductor devices 12, a spacing $S_3$ between a centrally located pair of power semiconductor devices 12 is arranged in a center position of the row 34. In certain embodiments, the spacing $S_3$ may be the largest and the remaining spacings $S_1$, $S_2$, $S_4$, $S_5$, may progressively decrease toward each end of the row 34. As indicated by the series of superimposed dots on either side of the row 34, the pattern illustrated in FIG. 5 may repeat such that the row 34 includes larger quantities of even-numbered power semiconductor devices 12. FIG. 6 illustrates a top view of an odd-numbered row 36 of power semiconductor devices 12 that may be provided in any of the power modules described herein. For the odd-numbered row 36, one of the power semiconductor devices 12 (i.e., between the spacings $S_3$ and $S_4$) may reside in a center position of the row 36. In certain embodiments, the spacings $S_3$ and $S_4$ at central portions of the row 36 may have the largest values and the remaining spacings $S_1$, $S_2$, $S_5$, $S_6$, may progressively decrease toward each end of the row 34. As indicated by the series of dots on either side of the row 36, the pattern illustrated in FIG. 6 may repeat such that the row 36 includes larger quantities of odd-numbered power semiconductor devices 12. In this regard, FIGS. 5 and 6 illustrate embodiments with variable row spacing that progressively decreases from a row center toward opposing peripheral ends in order to provide improved thermal profiles across each of the rows. Additionally, this may be accomplished while defining the rows 34, 36 with spacings $S_1$ to $S_5$ (FIG. 5) or $S_1$ to $S_6$ (FIG. 6) that are less than the width W of each of the power semiconductor devices 12 in the first direction. In particular, the spacings $S_1$ to $S_5$ (FIG. 5) or $S_1$ to $S_6$ (FIG. 6) may comprise any of the ranges described above for FIG. 3B, depending on a size of the power semiconductor devices 12.

It is appreciated that the arrangements illustrated in FIGS. 3B, 4B, 5, and 6 may be implemented alone or in various combinations in any of the power modules in any of the figures of the present disclosure. While the embodiments described above for FIGS. 3B, 4B, 5, and 6 illustrate positions of next-adjacent power semiconductor devices to form rows with a linear arrangement along a first direction, the principles of the present disclosure are applicable to nonlinear row arrangements. For example, nonlinear rows may include variable arrangements in a second direction, alone or in combination with the first direction. Second directions for rows may be defined as any direction that is different than the first direction in which the row of power semiconductor devices extends. For example, in certain embodiments the second direction may be defined as perpendicular to the first direction. Positions of next-adjacent semiconductor devices may be offset relative to one another along the second direction. Exemplary arrangements include wide V patterns, zig-zag patterns, and curved patterns that may be provided separately from or in combination with variable spacing of power semiconductor devices in the first direction of the row. By providing variable arrangements in a second direction, thermal crowding in power semiconductor device layouts may further be mitigated.

Figure 7:
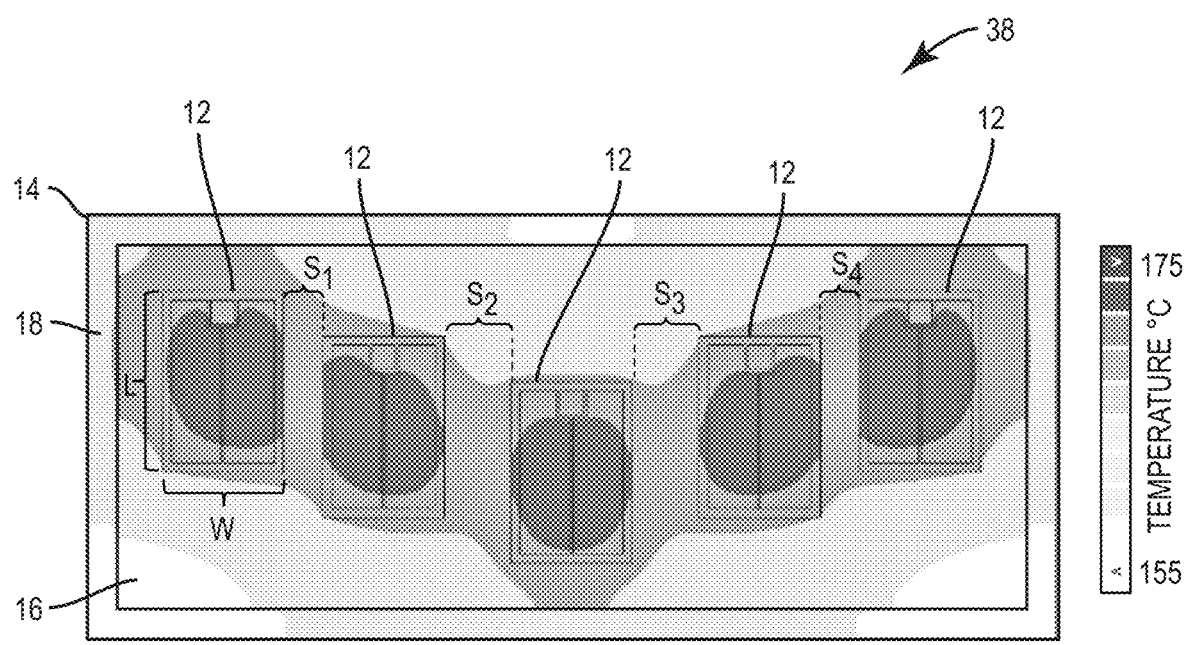
FIG. 7 illustrates a thermal simulation from a top view of a portion of a power module that is similar to the power module of FIG. 4B, but where the row of power semiconductor devices is provided with a nonlinear arrangement according to certain aspects of the present disclosure.

FIG. 7 illustrates a thermal simulation from a top view of a portion of a power module 38 that is similar to the power module 32 of FIG. 4B, but where the row of power semiconductor devices 12 is provided with a nonlinear arrangement. As with previous embodiments, the row may be defined with spacings $S_1$ to $S_4$ that are less than the width W of each of the power semiconductor devices 12 in the first direction (e.g., a horizontal direction in FIG. 7). In particular, the spacings $S_1$ to $S_4$ may comprise any of the ranges described above for FIG. 3B, depending on a size of the power semiconductor devices 12. In FIG. 7, the central spacings $S_2$, $S_3$ are larger than the end spacings $S_1$, $S_4$ in the first direction as previously described. As further illustrated, the relative position of each power semiconductor device 12 is offset with a next-adjacent one in a second direction that is different than the first direction. In FIG. 7, the second direction may be defined as perpendicular to the first direction. In this regard, the thermal gradients may be reduced along the row while also arranging the thermal profile of the row in a nonlinear manner. Such arrangements may be beneficial for tailoring thermal profiles based on other elements or structures of power modules that may influence heat dissipation.

Figure 8:
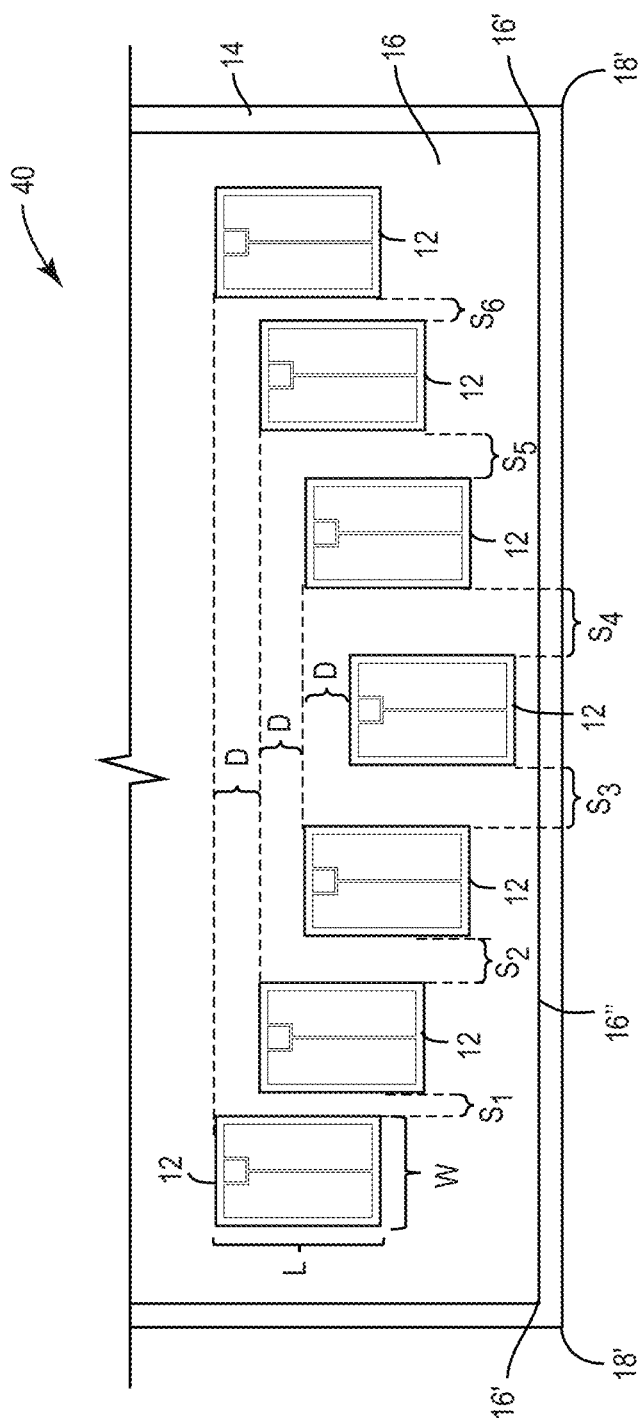
FIG. 8 is a top view of a portion of a power module that is similar to the power module of FIG. 7, but where the row of the power semiconductor devices is arranged to increase spacing between end power semiconductor devices of the row and corners of the substrate according to certain aspects of the present disclosure.

FIG. 8 is a top view of a portion of a power module 40 that is similar to the power module 38 of FIG. 7, but where the row of the power semiconductor devices 12 is arranged to increase spacing between end power semiconductor devices 12 of the row and corners 16' of the metal trace 16 and/or corners 18' of the dielectric layer 18 of the substrate 14. As with previous embodiments, the row may be defined with spacings $S_1$ to $S_6$ that are less than the width W of each of the power semiconductor devices 12 in the first direction (e.g., a horizontal direction in FIG. 8). In particular, the spacings $S_1$ to $S_6$ may comprise any of the ranges described above for FIG. 3B, depending on a size of the power semiconductor devices 12. In certain applications, delamination and/or failure of various device and/or substrate attach layers can begin at the corners of the substrate 14, where thermal spreading can be limited. Power semiconductor devices 12 that are positioned closely to these corners 16', 18' may be the first of the row to fail under thermal stress. This can be accelerated as the delaminated attach results in increased thermal resistance, higher temperatures, and even higher stress.

In FIG. 8, the variable positioning along the second direction may provide an arrangement where the end power semiconductor devices 12 of the row are positioned farther away from the corners 16', 18' than in FIG. 7. In some instances, one or more of the center power semiconductor devices 12 of the row may be positioned more closely to a peripheral edge of the substrate 14. However, a peripheral edge 16" of the metal trace 16 may provide more pathways for thermal spreading as compared to the corners 16'. As with FIG. 7, the spacings $S_1$ to $S_6$ between power semiconductor devices 12 along the first direction may be variable, such as larger in the middle of the row and smaller near ends of the row. In other embodiments, the spacings $S_1$ to $S_6$ may be uniform. Additionally, next-adjacent pairs of the power semiconductor devices 12 may be offset with one another by an offset distance D as measured in the second direction (e.g., a vertical direction in FIG. 8). In certain embodiments, the offset distance D may be the same or uniform across the entire row of power semiconductor devices 12. In certain embodiments, the offset distance D may be less than the length L of the power semiconductor devices 12 such that there is overlap along the row of power semiconductor devices 12. For example, the offset distance D may be provided with a value that is less than or equal to 5 mm, or less than or equal to 2.5 mm, or less than or equal to 1 mm, or in any range from above 0 mm to any of the aforementioned upper boundaries, for example in a range from greater than 0 mm to 5 mm, or in a range from greater than 0 mm to 2.5 mm, or in a range from greater than 0 mm to 1 mm, or in a range from 0.5 mm to 5 mm, or in a range from 0.5 mm to 2.5 mm, or in a range from 0.5 mm to 1 mm, depending on the relative size of the power semiconductor devices 12. As with any of the embodiments of the present disclosure, the principles described above are equally applicable to embodiments where the dielectric layer 18 is omitted and the metal trace 16 and corners 16' thereof embody a lead frame structure.

Figure 9:
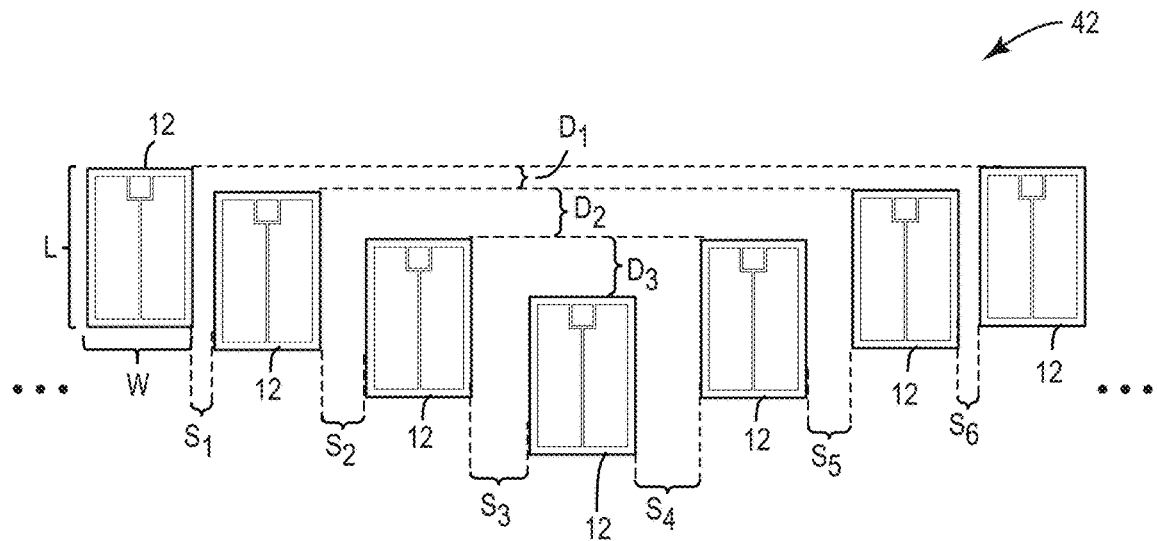
FIG. 9 illustrates a top view of a row of power semiconductor devices with an alternative arrangement than the row illustrated in FIG. 8 according to other aspects of the present disclosure.

FIG. 9 illustrates a top view of a row 42 of power semiconductor devices 12 with an alternative arrangement than the row illustrated in FIG. 8. In this regard, the arrangement of the power semiconductor devices 12 in FIG. 9 may also be implemented in the power module 40 of FIG. 8 or in any of the power modules in any of the figures of the present disclosure. In FIG. 9, offset distances $D_1$ to $D_3$ are varied in the second direction (e.g., a vertical direction in FIG. 9). For example, the offset distance $D_1$ may be smaller at peripheral portions of the row 42, as compared with the offset distance $D_3$ at central portions of the row 42. In certain embodiments, the offset distances $D_1$ to $D_3$ may progressively decrease from the peripheral portions to the central portions of the row 42 such that $D_1$ is less than $D_2$, and $D_2$ is less than $D_3$. As with FIG. 8, the spacings $S_1$ to $S_6$ between the power semiconductor devices 12 along the first direction (e.g., a horizontal direction of FIG. 9) may be variable, such as larger in the middle of the row 42 and smaller near ends of the row 42. In other embodiments, the spacings $S_1$ to $S_6$ may be uniform such that only the offset distances $D_1$ to $D_3$ are variable. The offset distances $D_1$ to $D_3$ may comprise any of values described above for the offset distance D of FIG. 8. As with previous embodiments, the row may be defined with spacings $S_1$ to $S_6$ that are less than the width W of each of the power semiconductor devices 12 in the first direction (e.g., a horizontal direction in FIG. 9). In particular, the spacings $S_1$ to $S_6$ may comprise any of the ranges described above for FIG. 3B, depending on a size of the power semiconductor devices 12. In certain embodiments, the pattern illustrated in FIG. 9 may repeat to form the row 42 with larger numbers of the power semiconductor devices 12, as indicated by the superimposed dots on either side of the row 42.

Figure 10:
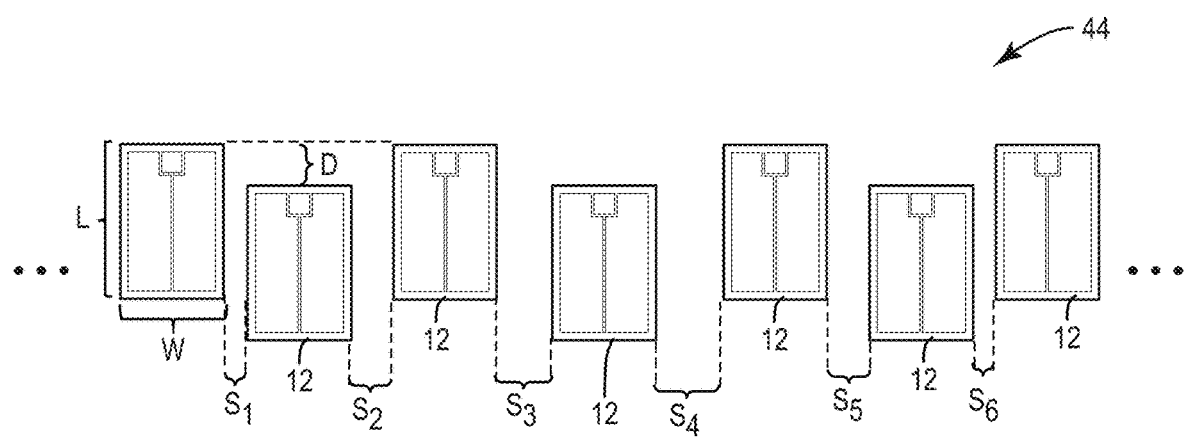
FIG. 10 illustrates a top view of a row of power semiconductor devices where positions of the power semiconductor devices alternate along the row according to certain aspects of the present disclosure.

FIG. 10 illustrates a top view of a row 44 where positions of the power semiconductor devices 12 alternate along the row 44. For example, the row 44 may extend in the first direction (e.g., a horizontal direction of FIG. 10) and each next-adjacent power semiconductor device 12 may be arranged in an alternating offset position in the second direction (e.g., a vertical direction of FIG. 10) along the row 44. In certain embodiments, the nonlinear arrangement may form a zig-zag arrangement across the row 44. The offset distance D between each next-adjacent pair of power semiconductor devices 12 may be constant across the row 44. In other configurations, the offset distance D may vary as needed to compensate for thermal overlap. In certain embodiments, the offset distance D may be less than the length L of the power semiconductor devices 12 such that there is positional overlap along the row 44. The offset distance D may comprise any of values described above for of FIG. 8. As with previous embodiments, the spacings $S_1$ to $S_6$ between power semiconductor devices 12 along the first direction may be variable, such as larger in the middle of the row and smaller near ends of the row. In other embodiments, the spacings $S_1$ to $S_6$ may be uniform. Additionally, the row may be defined with spacings $S_1$ to $S_6$ that are less than the width W of each of the power semiconductor devices 12 in the first direction (e.g., a horizontal direction in FIG. 10). In particular, the spacings $S_1$ to $S_6$ may comprise any of the ranges described above for FIG. 3B, depending on a size of the power semiconductor devices 12. In certain embodiments, the pattern illustrated in FIG. 10 may repeat to form the row 44 with larger numbers of the power semiconductor devices 12, as indicated by the superimposed dots on either side of the row 44.

Figure 11:
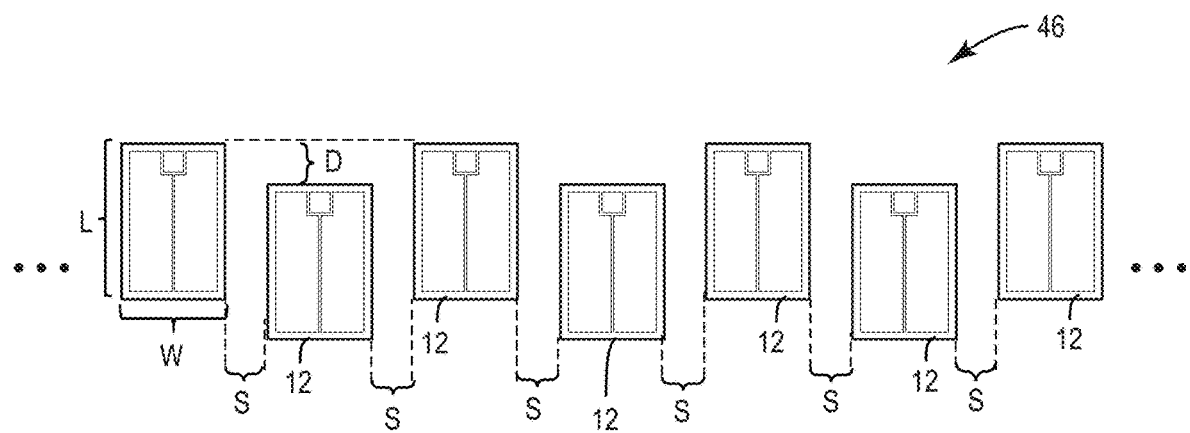
FIG. 11 illustrates a top view of a row of power semiconductor devices that is similar to the row of FIG. 10, but where spacings between next-adjacent power semiconductor devices are uniform across the row according to certain aspects of the present disclosure.

FIG. 11 illustrates a top view of a row 46 that is similar to the row 44 of FIG. 10, but where the spacings S between next-adjacent power semiconductor devices 12 are uniform across the row 46. In this manner, the power semiconductor devices 12 may extend in the first direction (e.g., a horizontal direction of FIG. 11) with uniform spacings S while positions of each next-adjacent power semiconductor device 12 may be arranged in a variable manner in the second direction (e.g., a vertical direction of FIG. 11). For example, the nonlinear arrangement may provide alternating offset positions that form a zig-zag arrangement across the row 46.

The offset distance D between each next-adjacent pair of power semiconductor devices 12 may be constant across the row 46. In other configurations, the offset distance D may vary as needed to compensate for thermal overlap. In certain embodiments, the offset distance D may be less than the length L of the power semiconductor devices 12 such that there is positional overlap along the row 46. The offset distance D may comprise any of values described above for FIG. 8. As with previous embodiments, the row may be defined with spacings S that are less than the width W of each of the power semiconductor devices 12 in the first direction. In particular, the spacings S may comprise any of the ranges described above for FIG. 3B, depending on a size of the power semiconductor devices 12. In certain embodiments, the pattern illustrated in FIG. 11 may repeat to form the row 46 with larger numbers of the power semiconductor devices 12, as indicated by the superimposed dots on either side of the row 46.

Figure 12:
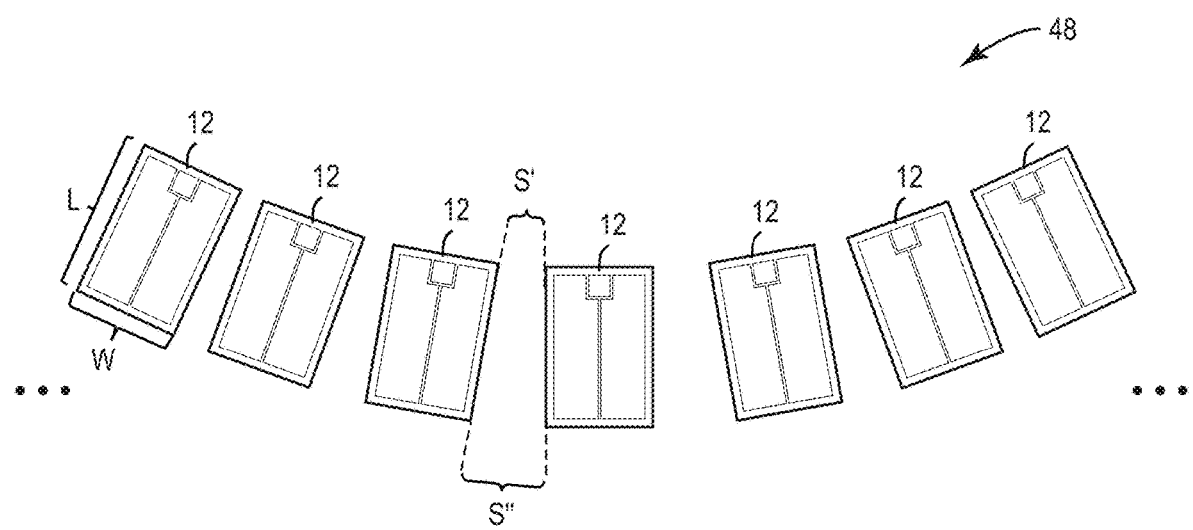
FIG. 12 illustrates a top view of a row of power semiconductor devices that is similar to previous embodiments, but where the power semiconductor devices are provided in a nonlinear arrangement that forms a curved shape for the row according to certain aspects of the present disclosure.

FIG. 12 illustrates a top view of a row 48 that is similar to previous embodiments, but where the power semiconductor devices 12 are provided in a nonlinear arrangement that forms a curved shape for the row 48. As illustrated, the curved arrangement may be formed by providing variable spacings S', S" between one or more next-adjacent pairs of the power semiconductor devices 12. For example, a spacing S' at one edge of the next-adjacent power semiconductor devices 12 may be smaller than a spacing S" at an opposite edge of the same next-adjacent power semiconductor devices 12. In certain embodiments, this variable spacing S', S" relationship may be repeated partially throughout the row 48 to provide curves along portions of the row 48. In other embodiments, the variable spacings S', S" may be provided throughout the row 48. As with previous embodiments, the row 48 may be defined with the spacings S', S" across the row 48 that are less than the width W of each of the power semiconductor devices 12. In particular, the spacings S', S" may comprise any of the ranges described above for FIG. 3B, depending on a size of the power semiconductor devices 12. In certain embodiments, the pattern illustrated in FIG. 12 may repeat to form the row 48 with larger numbers of the power semiconductor devices 12, as indicated by the superimposed dots on either side of the row 48.

It is appreciated that the arrangements illustrated in FIGS. 3B, 4B, and 5-12 may be implemented alone or in various combinations with one another in any of the power modules in any of the figures of the present disclosure. As described above, the arrangements illustrated in FIGS. 3B, 4B, and 5-12 may be particularly useful for rows of paralleled power semiconductor devices. The various arrangements in these figures may provide reduced thermal gradients in rows of power semiconductor devices, thereby allowing improved operating characteristics and/or increased operating lifetimes. The reduced thermal gradients may further be provided while maintaining spacings between next-adjacent semiconductor devices that define each row with values that are less than the widths of the power semiconductor devices. In this manner, active areas of power devices and/or modules may include a high density of power semiconductor devices that also exhibit improved thermal profiles during operation.

Figure 13A:
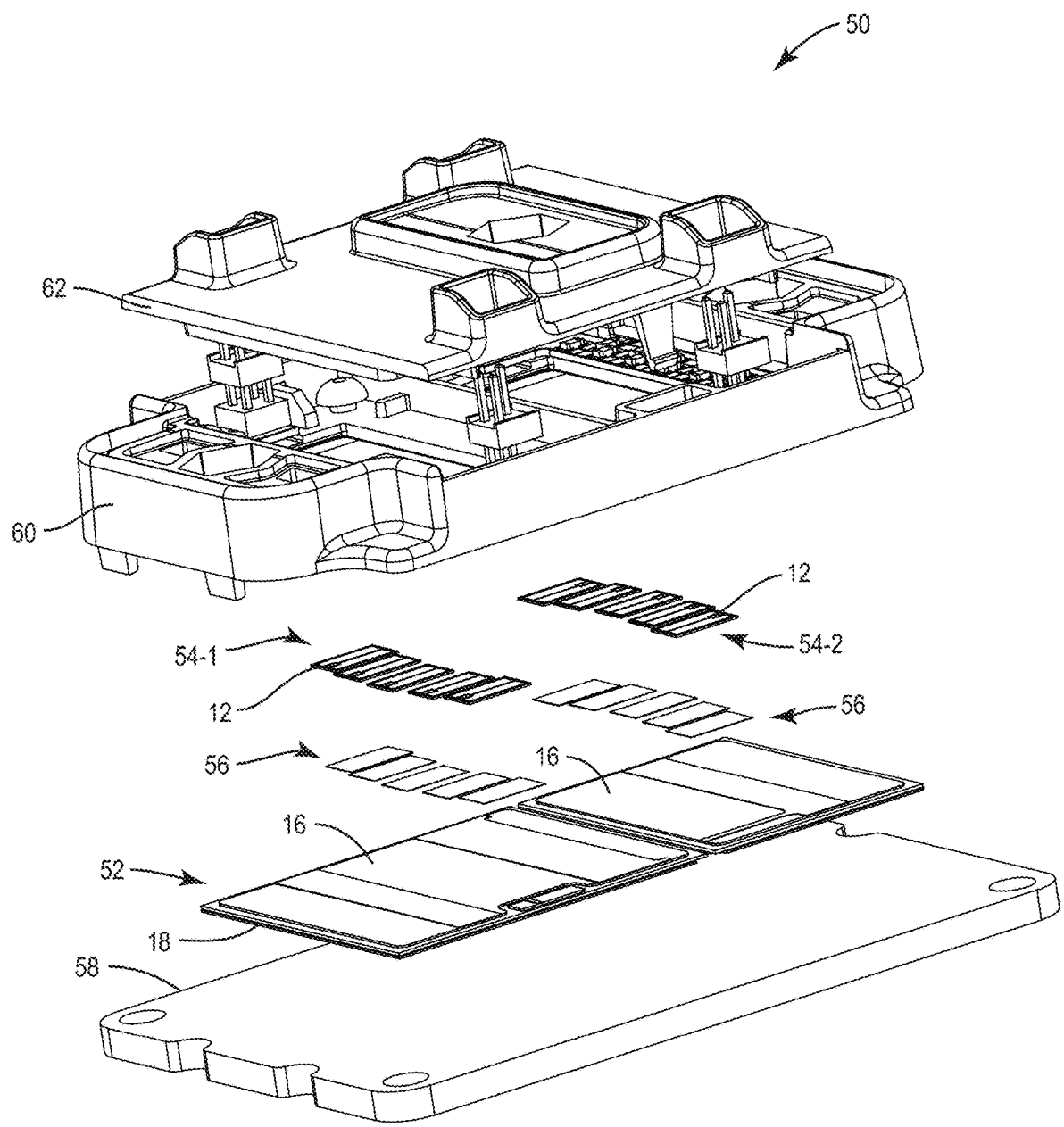
FIG. 13A is an exploded view of an exemplary power module that may include any of the arrangements for power semiconductor devices described herein according to various aspects of the present disclosure.

The arrangements of the power semiconductor devices may be provided in variety of packages and power module structures. FIG. 13A is an exploded view of an exemplary power module 50 according to aspects of the present disclosure. The power module 50 may include a substrate 52 that may include the dielectric layer 18 and one or more metal traces 16 as previously described. Alternatively, the dielectric layer 18 may be omitted and the metal traces 16 may embody one or more lead frame structures. The power semiconductor devices 12 may be arranged in one or more rows 54-1, 54-2 with arrangements according to any of the previously described embodiments. The power semiconductor devices 12 may be mounted to the metal traces 16 by way of device attach material 56, which may include at least one of solder material, sintered metal, or the like that provides mechanical structure, high current interconnection, and high thermal conductivity. The substrate 52 may be bonded or otherwise attached to a baseplate 58 that may provide mechanical support and/or additional thermal spreading characteristics for the power module 50. With any of the arrangements described above for FIGS. 3B, 4B, and 5-12, improved thermal balancing may allow thicker device attach materials 56 and/or thicker attach materials between the substrate 52 and the baseplate 58. Increased thicknesses of such attach materials may generally improve bonding for improved reliability. Although thicker attach materials tend to also increase thermal resistance, the arrangements of the power semiconductor devices 12 according to any of the previously described embodiments may advantageously allow use of such thicker attach materials.

In certain embodiments, the baseplate 58 may comprise a thermally conductive material, for example copper, copper alloys, aluminum, aluminum alloys, aluminum silicon carbide, and the like. In certain embodiments, the dielectric layer 18 of the substrate 52 may comprise one or more of aluminum nitride, aluminum oxide, silicon nitride, and the like. A housing 60 and cover structure 62 may be arranged to complete the package. The housing 60 and/or the cover structure 62 may be formed using a transfer or an injection molding process to provide mechanical structure and high voltage isolation. The housing 60 and/or the cover structure 62 may be formed to encapsulate the internal parts of the power module 50, along with the baseplate 58. The mold compound used for the housing 60 and/or the cover structure 62 may be a transfer or compression molded epoxy molding compound (EMC) capable of providing mechanical structure, high voltage isolation, coefficient of thermal expansion (CTE) matching, and low humidity absorption. The housing 60 and/or the cover structure 62 may also include or facilitate various electrical connections for the power module 50.

Figure 13B:
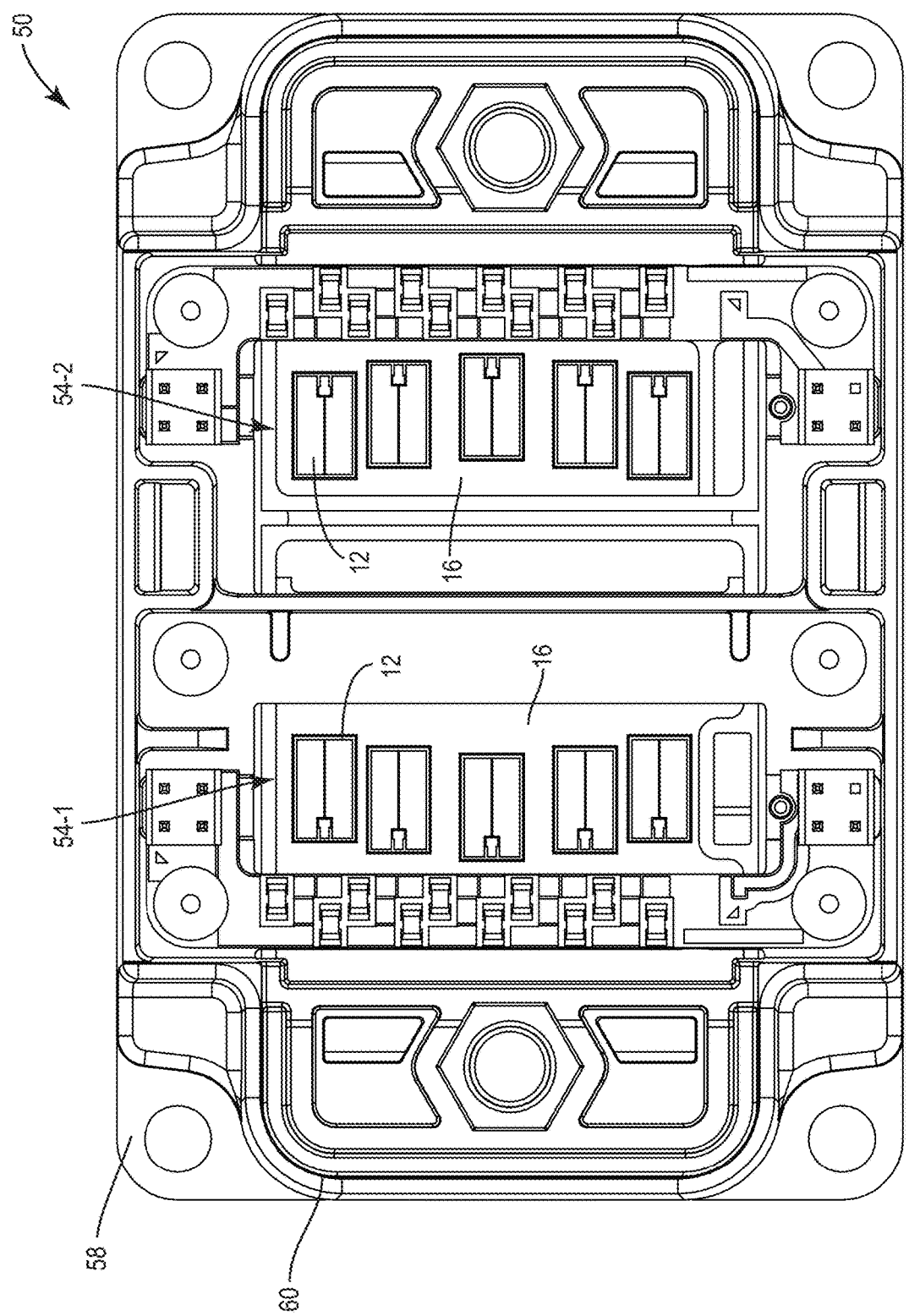
FIG. 13B is a partially assembled top view of the power module of FIG. 13A.

FIG. 13B is a partially assembled top view of the power module 50 of FIG. 13A. For illustrative purposes, the cover structure 62 is omitted to provide a better view of the rows 54-1, 54-2 of the power semiconductor devices 12. As illustrated, the rows 54-1, 54-2 may be formed with variable spacing between next-adjacent power semiconductor devices 12 according to any of the previously described embodiments, including FIGS. 3B, 4B, and 5-12. The rows 54-1, 54-2 may also be formed with any of the variable offset positions as described in any of the previously described embodiments, including FIGS. 7-12, alone or in combination with the variable spacing arrangements.

As previously described, the principles of any of the embodiments of the present disclosure, including FIGS. 1A-13B, are equally applicable to embodiments where the dielectric layer 18 may be omitted and the metal trace 16 embodies a lead frame structure. In this manner, the substrate 14 described in FIGS. 1A-13B may embody a power substrate or a lead frame structure that may be present in a power module.

As described herein, the principles of the present disclosure provide arrangements of power semiconductor devices, including paralleled power semiconductor devices, that are well suited for use in power packages and power modules for various applications. Exemplary benefits include operating performance and/or lifetime improvements for such power packages and/or power modules. The principles of the present disclosure may provide such benefits for various high power semiconductor applications, for example power conversion for electric power, battery chargers, wind and/or solar inverters, and power supplies, among other applications.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power module comprising:
    a substrate; and
    a plurality of power semiconductor devices on the substrate, wherein the plurality of power semiconductor devices are electrically coupled to form at least a portion of a power circuit, wherein:
        the plurality of power semiconductor devices are arranged in at least one row; and
        first next-adjacent power semiconductor devices of the plurality of power semiconductor devices are arranged along the at least one row with a spacing therebetween different from a spacing between second next-adjacent power semiconductor devices of the plurality of power semiconductor devices arranged along the at least one row.

2. The power module of claim 1, wherein the spacing between next-adjacent power semiconductor devices is larger along central portions of the at least one row.

3. The power module of claim 2, wherein the spacing between the next-adjacent power semiconductor devices is smaller along peripheral portions of the at least one row.

4. The power module of claim 1, wherein the at least one row extends in a first direction on the substrate and the spacing between next-adjacent power semiconductor devices is less than a width of each power semiconductor device of the plurality of power semiconductor devices, wherein the width is measured in the first direction.

5. The power module of claim 1, wherein each power semiconductor device of the plurality of power semiconductor devices in the at least one row is electrically coupled in parallel.

6. The power module of claim 1, wherein:
    the at least one row extends in a first direction on the substrate; and
    the spacing between next-adjacent power semiconductor devices along the at least one row decreases from a central portion of the at least one row toward a peripheral portion of the at least one row.

7. The power module of claim 6, wherein the plurality of power semiconductor devices in the at least one row comprises an even number of power semiconductor devices.

8. The power module of claim 6, wherein the plurality of power semiconductor devices in the at least one row comprises an odd number of power semiconductor devices.

9. The power module of claim 6, wherein positions of the next-adjacent power semiconductor devices are provided in a linear arrangement along the first direction of the at least one row.

10. The power module of claim 6, wherein positions of the next-adjacent power semiconductor devices are provided in a nonlinear arrangement along the first direction of the at least one row.

11. The power module of claim 10, wherein the positions of the next-adjacent power semiconductor devices of the plurality of power semiconductor devices are offset with one another by an offset distance as measured in a second direction that is different than the first direction.

12. The power module of claim 11, wherein the offset distance is uniform across the at least one row.

13. The power module of claim 11, wherein the offset distance is smaller at peripheral portions of the at least one row than at central portions of the at least one row.

14. The power module of claim 10, wherein the nonlinear arrangement forms a zig-zag arrangement along the at least one row.

15. The power module of claim 10, wherein the nonlinear arrangement comprises a curved arrangement along the at least one row.

16. The power module of claim 1, further comprising:
    a baseplate, wherein the substrate is arranged on the baseplate;
    a housing on the baseplate; and
    a cover over the housing, wherein the baseplate, the housing, and the cover are arranged to enclose the plurality of power semiconductor devices.

17. The power module of claim 1, wherein the spacing is in a range from greater than 0 millimeters (mm) to 5 mm.

18. The power module of claim 1, wherein the substrate comprises at least one of a lead frame structure and a power substrate.

19. A power module comprising:
    a substrate; and
    a plurality of power semiconductor devices on the substrate, wherein the plurality of power semiconductor devices are electrically coupled to form at least a portion of a power circuit, wherein:
        the plurality of power semiconductor devices comprise a nonlinear arrangement along at least one row that extends in a first direction on the substrate; and
        positions of next-adjacent power semiconductor devices of the plurality of power semiconductor devices are offset with one another by an offset distance as measured in a second direction that is different than the first direction.

20. The power module of claim 19, wherein a spacing between the next-adjacent power semiconductor devices along the first direction is uniform.

21. The power module of claim 19, wherein first next-adjacent power semiconductor devices of the plurality of power semiconductor devices are arranged along the at least one row with a spacing therebetween different from a spacing between second next-adjacent power semiconductor devices of the plurality of power semiconductor devices arranged along the at least one row.

22. The power module of claim 19, wherein the offset distance is uniform across the at least one row.

23. The power module of claim 19, wherein the offset distance is smaller at peripheral portions of the at least one row than at central portions of the at least one row.

24. The power module of claim 19, wherein the offset distance is less than a length of each of the next-adjacent power semiconductor devices, wherein the length is measured in the second direction.

25. The power module of claim 19, wherein the positions of the next-adjacent power semiconductor devices forms a zig-zag arrangement along the at least one row.

26. The power module of claim 19, wherein a spacing between the next-adjacent power semiconductor devices along the first direction is less than a width of each power semiconductor device of the plurality of power semiconductor devices in the at least one row.

27. The power module of claim 19, wherein each power semiconductor device of the plurality of power semiconductor devices in the at least one row is electrically coupled in parallel.

28. The power module of claim 19, wherein the substrate comprises at least one of a lead frame structure and a power substrate.

29. A method comprising:
providing a power module;
providing a plurality of power semiconductor devices along at least one row within the power module; and
determining an arrangement of the at least one row based on a predetermined thermal profile of the plurality of power semiconductor devices,
wherein the at least one row comprises first next-adjacent power semiconductor devices of the plurality of power semiconductor devices with an offset distance therebetween different from an offset distance between second next-adjacent power semiconductor devices of the plurality of power semiconductor devices arranged along the at least one row.

30. The method of claim 29, wherein the predetermined thermal profile is based on a uniform spacing between next-adjacent power semiconductor devices that is less than a width of each power semiconductor device.

31. The method of claim 30, wherein the uniform spacing between the next-adjacent power semiconductor devices is less than the width of each power semiconductor device.

32. The method of claim 29, wherein:
the at least one row extends in a first direction; and
the offset distance is less than a length of each of next-adjacent power semiconductor devices, wherein the length is measured in a second direction that is different than the first direction.

33. The method of claim 29, wherein the offset distance is smaller at peripheral portions of the at least one row than at central portions of the at least one row.

\* \* \* \* \*